United States Patent
Wörz et al.

(10) Patent No.: US 6,538,895 B2
(45) Date of Patent: Mar. 25, 2003

(54) TSOP MEMORY CHIP HOUSING CONFIGURATION

(75) Inventors: Andreas Wörz, Kelheim (DE); Alfred Gottlieb, Nittendorf/Undorf (DE); Bernd Römer, Bernhardswald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/047,815

(22) Filed: Jan. 15, 2002

(65) Prior Publication Data
US 2003/0012002 A1 Jan. 16, 2003

Related U.S. Application Data

(63) Continuation of application No. PCT/DE00/02292, filed on Jul. 13, 2000.

(30) Foreign Application Priority Data

Jul. 15, 1999 (DE) .......................... 199 33 265

(51) Int. Cl.$^7$ ................................ H01L 23/48
(52) U.S. Cl. .................... 361/735; 257/686; 257/692
(58) Field of Search ................. 257/685, 686, 257/690, 692, 694, 696, 697, 723, 730, 777; 361/735, 772, 773, 776, 790, 791

(56) References Cited

U.S. PATENT DOCUMENTS

| | | |
|---|---|---|
| 5,147,815 A | 9/1992 | Casto |
| 5,455,740 A | 10/1995 | Burns |
| 5,484,959 A | 1/1996 | Burns |
| 5,541,812 A | 7/1996 | Burns |
| 5,587,341 A | 12/1996 | Masayuki et al. |
| 5,910,885 A | 6/1999 | Gulachenski et al. |
| 5,960,539 A * | 10/1999 | Burns .................... 29/854 |

FOREIGN PATENT DOCUMENTS

| | | |
|---|---|---|
| DE | 42 15 467 A1 | 11/1992 |
| JP | 08 051 183 A | 2/1996 |
| JP | 08 125 118 A | 5/1996 |
| JP | 09 283 702 A | 10/1997 |

* cited by examiner

Primary Examiner—Kamand Cuneo
Assistant Examiner—L. Cruz
(74) Attorney, Agent, or Firm—Laurence A. Greenberg; Werner H. Stemer; Ralph E. Locher

(57) ABSTRACT

A configuration of at least two TSOP memory chip housings stacked one on another, is described. Each of the TSOP memory chip housings has at least one memory chip with a number of pins disposed in an interior of the TSOP memory chip housing. The pins leading out of a respective TSOP memory chip housing and, via a rewiring configuration, are connected to pins leading out of a respectively directly adjacent TSOP memory chip housing of the same TSOP memory chip housing stack. In order to be able to produce such a housing stack as cost-effectively and simply as possible by an automated mounting method, the rewiring configuration is implemented in the form of leadframes respectively disposed between or at the side between the individual TSOP memory chip housings.

7 Claims, 4 Drawing Sheets

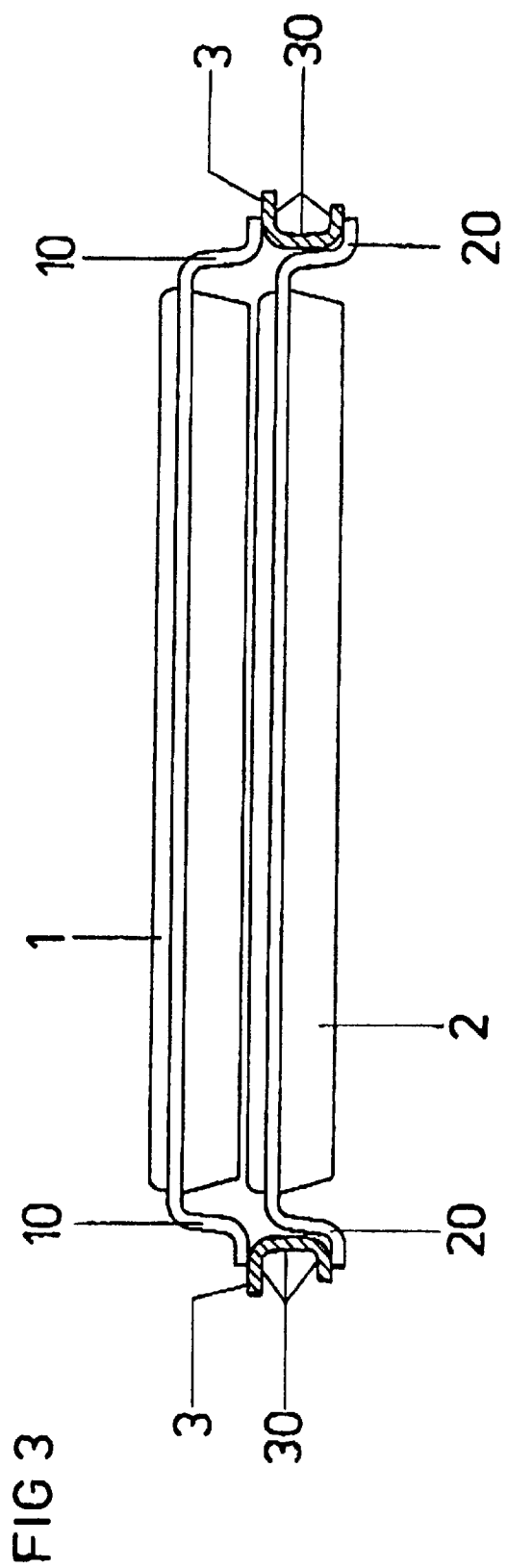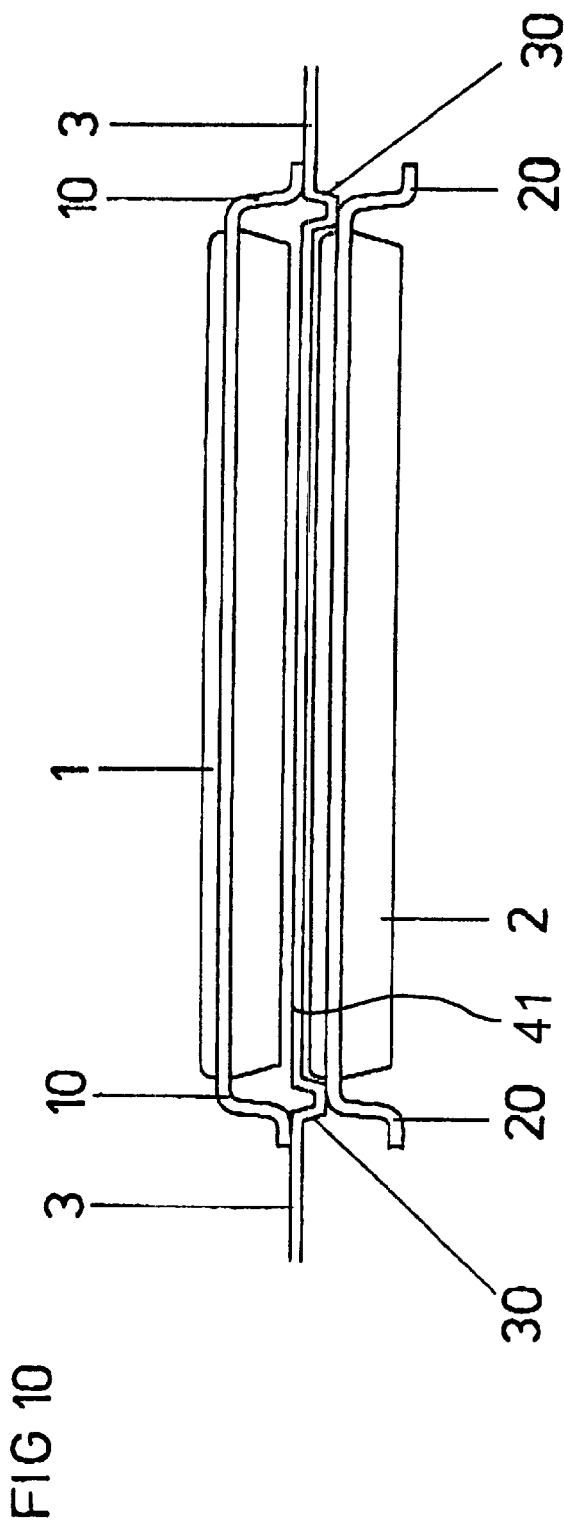

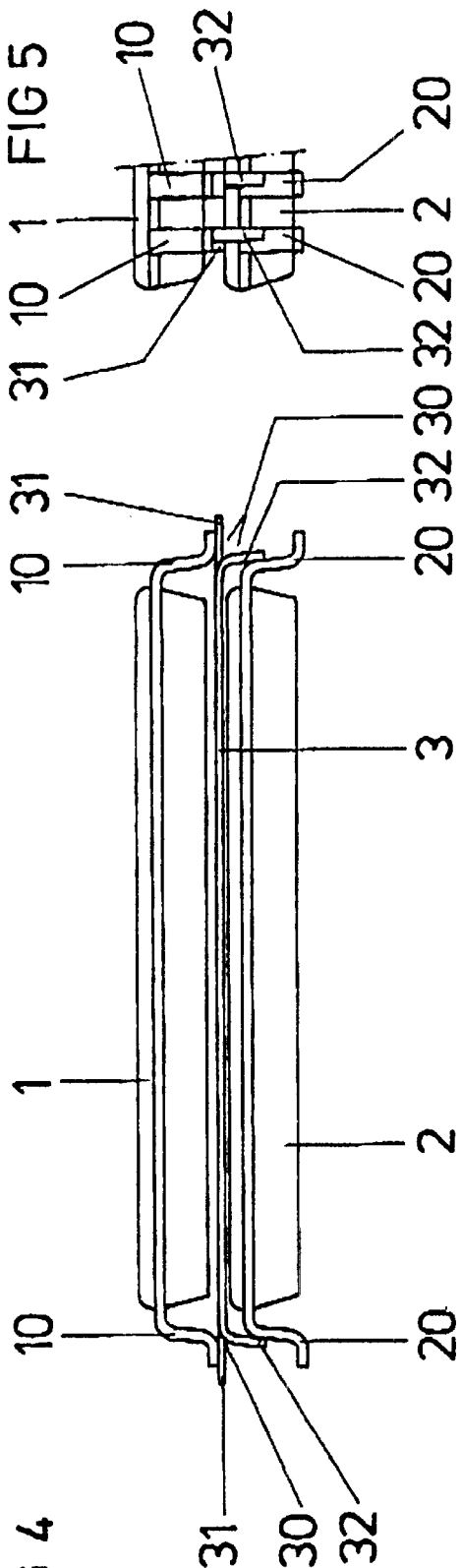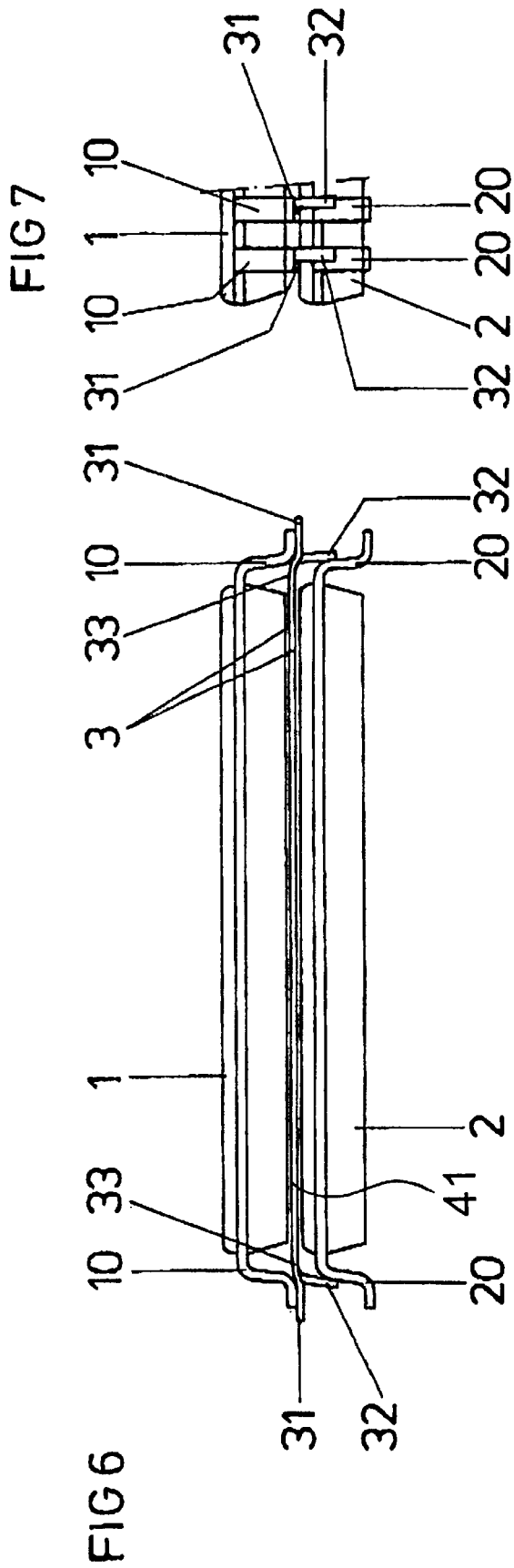

TSOP MEMORY CHIP HOUSING CONFIGURATION

CROSS-REFERENCE TO RELATED APPLICATION

This application is a continuation of copending International Application PCT/DE00/02292, filed Jul. 13, 2000, which designated the United States.

BACKGROUND OF THE INVENTION

Field of the Invention

The invention relates to a configuration of at least two TSOP memory chip housings stacked one on another and a rewiring configuration formed as a leadframe having connecting lines with free ends. The TSOP memory chip housings have contours of identical cross section, including a first TSOP memory chip housing and a second TSOP memory chip housing, stacked one on another. Each of the two TSOP memory chip housings have an interior and at least one memory chip with a number of pins disposed in the interior of each of the two TSOP memory chip housings. The leadframe is disposed between the two TSOP memory chip housings or at a side between the two TSOP memory chip housings. The pins leading out of the first TSOP memory chip housing are connected through the leadframe to the pins leading out of the second TSOP memory chip housing. The pins have ends leading out of the two TSOP memory chip housings and the ends are formed in a shape of s-shaped ends in cross-section, step-shaped ends in cross section, kinked over downward ends or kinked over upward ends. The pins of different ones of the TSOP memory chip housings are disposed one over another and aligned in parallel with one another in space.

The thin small online package (TSOP) memory chip housings contain in their interior at least one memory chip, which has a number of pins which are led out of the respective TSOP memory chip housing. The storage capacity of such TSOP memory chip housings can be multiplied by stacking individual housings one on another. At the same time, however, care must be taken that identically wired memory chips are driven by different pins. It is therefore necessary, and has already been proposed, to provide a rewiring plane which, at the same time, connects the respective pins of the housings stacked one on another to one another.

It has already been proposed to implement such TSOP memory chip housings stacked one on another with the aid of small integrated circuits (printed circuit boards), or with the aid of connecting leadframes ("leadframes") on the outside of the housing and with flexible materials (with bent-over legs) between the individual housings.

The proposed solutions are relatively complicated and can be used only conditionally for cost-effective automation of the manufacture of such housing stacks.

SUMMARY OF THE INVENTION

It is accordingly an object of the invention to provide a TSOP memory chip housing configuration which overcomes the above-mentioned disadvantages of the prior art devices of this general type, which is cost-effective in terms of its manufacture and in addition is suitable for automated manufacture.

With the foregoing and other objects in view there is provided, in accordance with the invention, a configuration containing a rewiring configuration formed as a leadframe having connecting lines with free ends. The free ends have a cross-sectional shape being groove-shaped free ends, trough-shaped free ends, u-shaped free ends or v-shaped free ends. At least two thin small online package (TSOP) memory chip housings are provided and have contours of identical cross section, including a first TSOP memory chip housing and a second TSOP memory chip housing, stacked one on another. Each of the two TSOP memory chip housings have an interior and at least one memory chip with a number of pins disposed in the interior of each of the two TSOP memory chip housings. The leadframe is disposed between the two TSOP memory chip housings or at a side between the two TSOP memory chip housings. The pins leading out of the first TSOP memory chip housing are connected through the leadframe to the pins leading out of the second TSOP memory chip housing. The pins have ends leading out of the two TSOP memory chip housings and the ends are formed as s-shaped ends in cross-section, step-shaped ends in cross section, kinked over downward ends or kinked over upward ends. The pins of different ones of the two TSOP memory chip housings are disposed one over another and aligned in parallel with one another in space.

The pins leading out of the respective TSOP memory chip housing and are connected to the respectively directly adjacent TSOP memory chip housing of the same TSOP memory chip housing stack via a rewiring configuration. The invention provides for the rewiring configuration to be implemented in the form of leadframes in each case disposed between or at the side between the individual TSOP memory chip housings.

The result of introducing the rewiring or connecting plane by leadframes between the individual housings or at the side between the housings is a series of advantages as compared with the other solutions already proposed and outlined further above. First, significant cost savings are achieved as a result of using the leadframe technique, known per se. Second, the introduction of rewiring planes between the housings is straightforwardly possible. Third, well-defined soldering areas can be defined in a straightforward way; the application of a solder deposit is possible. Fourth, lateral-soldering methods, such as a mini solder wave can be implemented.

In accordance with an added feature of the invention, the connecting lines of the leadframe are shaped at the free ends such that the free ends connect the pins in each case located directly one next another of the two TSOP memory chip housings.

In accordance with additional feature of the invention, at least one of the two TSOP memory chip housings is connected mechanically to the leadframe, preferably by an adhesive bond.

In accordance with a further feature of the invention, the pins are soldered or welded to the free ends of the connecting lines of the leadframe.

With the foregoing and other objects in view there is provided, in accordance with the invention, a configuration containing thin small online package (TSOP) memory chip housings having contours of identical cross section. Each of the TSOP memory chip housings have an interior and at least one memory chip with a number of pins disposed in the interior of each of the TSOP memory chip housings and the pins lead out of the TSOP memory chip housings. A plurality of leadframes are provided and each have connecting lines with free ends. The free ends have a cross-sectional shape being groove-shaped free ends, trough-shaped free ends, u-shaped free ends or v-shaped free ends. Each of the leadframes is disposed between two of the TSOP memory chip housings or at a side between two of the TSOP memory chip housings. A respective one of the leadframes and a respective two of the TSOP memory chip housings including a first TSOP memory chip housing and a second TSOP memory chip housing, stacked one on another with the respective leadframe disposed inbetween forms one of a plurality of stacks. The pins leading out of the first TSOP memory chip housing are connected through the respective leadframe to the pins leading out of the second TSOP memory chip housing. The pins have ends leading out of the two TSOP memory chip housings and the ends are formed as s-shaped ends in cross-section, step-shaped ends in cross section, kinked over downward ends or kinked over upward ends. The pins of different ones of the two TSOP memory chip housings are disposed one over another and aligned in parallel with one another in space.

In accordance with a concomitant feature of the invention, a common carrier is provided, and at least two of the stacks are disposed beside one another, and in that the leadframes of the at least two stacks are disposed on the common carrier.

Other features which are considered as characteristic for the invention are set forth in the appended claims.

Although the invention is illustrated and described herein as embodied in a TSOP memory chip housing configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross-sectional view of a third advantageous embodiment of the configuration according to the invention;

FIG. 4 is a cross-sectional view of a fourth advantageous embodiment of the configuration according to the invention;

FIG. 5 is a side-elevational view of the configuration according to FIG. 4 as an extract and rotated through 90 degrees about a vertical axis;

FIG. 6 is a cross-sectional view of a fifth advantageous exemplary embodiment of the configuration according to the invention;

FIG. 7 is a side-elevational view of the configuration according to FIG. 6 in an extract and rotated through 90 degrees about the vertical axis;

FIG. 10 is a cross-sectional view of a sixth advantageous exemplary embodiment of the configuration according to the invention;

DESCRIPTION OF THE PREFERRED EMBODIMENTS

Figure 1:
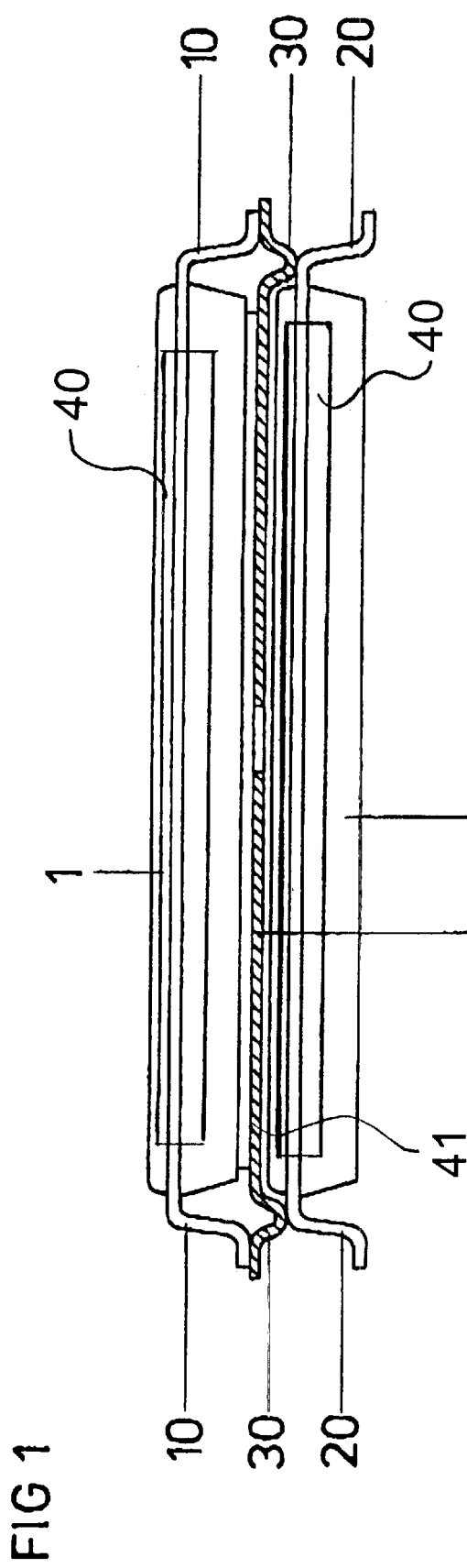
FIG. 1 is a diagrammatic, cross-sectional view of a first advantageous embodiment of a configuration according to the invention.

In all the figures of the drawing, sub-features and integral parts that correspond to one another bear the same reference symbol in each case. Referring now to the figures of the drawing in detail and first, particularly, to FIG. 1 thereof, there is shown, in cross section from a side perspective, two TSOP memory chip housings 1 and 2 stacked on one another. The housings 1, 2 each have at least one memory chip 40 with pins 10, 20 disposed therein. The pins 10, 20 project out of the housing 1,2 and are bent in an s-shaped cross section (specialist term: "gull wing" shaped). The pins 10, 20 are aligned in parallel with one another in space and are connected to one another by a leadframe 3 serving as a rewiring and connecting configuration, specifically in such a way that the individual connecting lines 41 of the leadframe 3 are shaped with a u-shaped cross section at a free end 30. The individual pins 10 of the upper housing 1 are connected to the respective outer limbs of the u-shaped bent free end 30 of the associated connecting line 41, and the individual pins 20 of the lower housing 2 are connected to the respective u-bend of the free end 30 of the associated connecting line 41.

The significant advantage of the configuration can be seen in the fact that no additional leg or pin bends are required on the housings 1 and 2 to be connected to each other.

Figure 2:
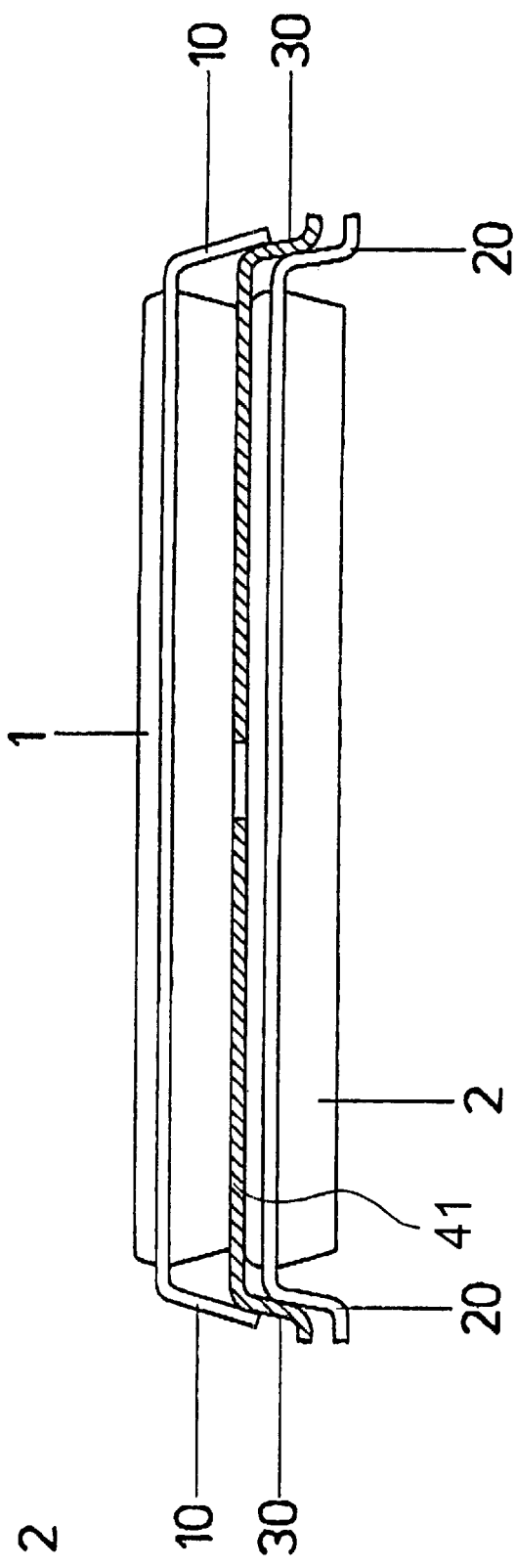
FIG. 2 is a cross-sectional view of a second advantageous embodiment of the configuration according to the invention.

The configuration in FIG. 2 differs from the configuration in FIG. 1 in that in FIG. 2 the free ends 30 of the individual connecting lines 41 of the leadframe 3 are bent with the s-shaped cross section, just like the pins 20 of the lower TSOP memory chip housing 2, and are aligned in parallel with one another in space. In the case of this construction, a single downwardly directed bend in the pins 10 of the upper TSOP memory chip housing 1 is sufficient in order to be able to produce the desired connection between the pins 10, 20 of the two housings 1, 2.

The significant advantage of the configuration is to be seen in the fact that the pins of the upper housing have to be bent only once.

The configuration according to FIG. 3 shows the two TSOP memory chip housings 1 and 2 stacked one on another in cross section from the side, the pins 10, 20 being connected to one another at the side via the leadframe 3 disposed at the side between the housings 1, 2. The individual connecting lines of the leadframe 3 are in this case of u-shaped cross section and are aligned in space in such a way that the free ends 30 of the respective connecting line, that is to say the limbs of the individual "u"s connect the associated pins 10, 20 of the two housings 1, 2 to one another.

The significant advantage of the configuration consists in that no additional leg bends, that is to say pin bends, are required on the housings 1, 2 to be connected (comparable with the configuration according to FIG. 1).

The configuration according to FIG. 4 and FIG. 5 likewise show the two TSOP memory chip housings 1 and 2 stacked one on another in cross section from the side, the pins 10, 20 being connected to one another via the leadframe 3 disposed between the housings 1, 2. The individual connecting lines 41 of the leadframe 3 are in this case split in a longitudinal direction at their free ends 30, one half 31 extending horizontally (without any bend upward or downward), while the other half 32 is bent downward. The two parts 31 and 32 of the free ends 30 of the individual connecting lines 41 of the leadframe 3 are in this case disposed in such a way that the horizontally aligned parts 31 of the free ends 30 make contact with the pins 10 of the upper housing 1, while the downwardly bent parts 32 of the free ends 30 make contact with the pins 20 of the lower housing 2.

The significant advantage of the configuration is to be seen in the fact that, in a similar way to that in the configurations according to FIG. 1 and FIG. 3, no additional legs, that is to say pin bends, are necessary on the housings 1, 2 to be connected.

The configuration according to FIG. 6 and FIG. 7 differs from the configuration according to FIG. 4 and FIG. 5 merely in the fact that the connecting lines 41 of the leadframe 3 are kinked downwards before the free ends 30 in each case split into two parts 31, 32 and, in an area of the kink 33, are in each case of s-shaped cross section.

The significant advantage of the configuration is to be seen in the fact that the horizontally aligned part 31 of the free ends 30 of the individual connecting lines 41 of the leadframe 3 is set down ("set lower") as compared with the configuration according to FIG. 4 and FIG. 5, as a result of which the spacing between the underside of the upper housing 1 and the leadframe 3 is reduced in size such that a reliable adhesive bond between the upper housing 1 and the leadframe 3 can readily be implemented.

In general, the configurations according to FIG. 1 to FIG. 7 are distinguished by the fact that the TSOP memory chip housings 1, 2 can be mounted in a very simple way, that a form fit and self-adjustment of the entire configuration is possible without additional effort during mounting, and in that automated mounting can readily be implemented. The configurations according to FIG. 4 to FIG. 7 are further distinguished by the fact that the self-adjustment can be implemented particularly simply, and mechanical fixing of the leadframe 3 to the two housings 1, 2 can be produced particularly simply.

Figure 8:
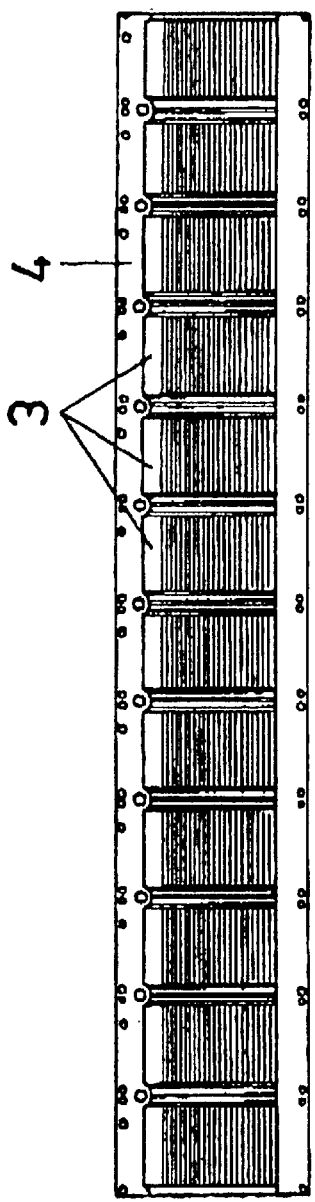
FIG. 8 is a top, plan view of an advantageous embodiment of a carrier from above with a number of leadframes disposed beside one another in accordance with the invention.

FIG. 8 shows from above a frame configuration, that is to say a carrier 4 for a number of the leadframes 3, containing a number of the leadframes 3 disposed beside one another. Here, in FIG. 8, the carrier 4 is configured in such a way that the TSOP memory chip housings 1, 2 can be mounted parallel to the end of the carrier 4.

Figure 9:
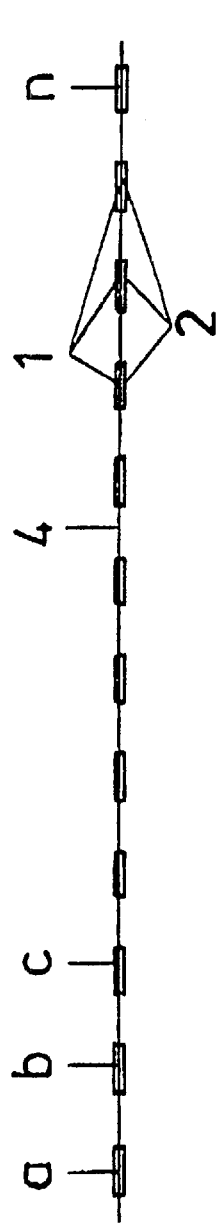
FIG. 9 is a side-elevational view of the leadframe according to FIG. 8, with mounted pairs of TSOP memory chip housings.

FIG. 9 shows the carrier 4 from a side perspective, with a number of stacks a-n of mounted pairs of the TSOP memory chip housings 1 and 2, which are connected to one another by the leadframe 3 respectively located between them.

The configuration in FIG. 10 shows, in a manner similar to the configuration according to FIG. 1, a cross section from the side of the two TSOP memory chip housings 1 and 2 stacked one on another, the pins 10 and 20 projecting from the housings 1, 2 being bent in an s-shape in cross section (specialist term: "gull wing" shaped), are aligned in parallel with one another in space and are connected to one another by the leadframe 3 serving as a rewiring and connecting configuration, specifically in such a way that the individual connecting lines of the leadframe 3 are shaped with a groove-shaped cross section at the free ends 30, so that the individual pins 10 of the upper housing 1 are connected to the respective outer limb of the groove-shaped bent free end 30 of the associated connecting line 41, and the individual pins 20 of the lower housing 2 are connected to the base of the respective groove at the free end 30 of the associated connecting line 41.

The significant advantage of this configuration, as in the configurations according to FIG. 1, FIG. 3, FIG. 4 and FIG. 5, FIG. 6 and FIG. 7, is to be seen in the fact that no additional leg or pin bends are necessary on the housings to be connected to one another.

Figure 11:
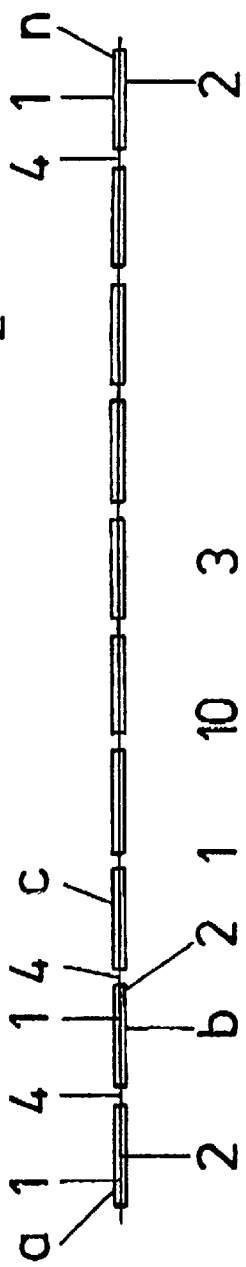
FIG. 11 is a side-elevational view of a carrier having a number of leadframes and TSOP memory chip housing stacks according to FIG. 10.

FIG. 11 shows a number of such housing/frame configurations a-n according to FIG. 10 disposed beside another on the common carrier 4, parallel to the long side, to be specific from the side.

Figure 12:
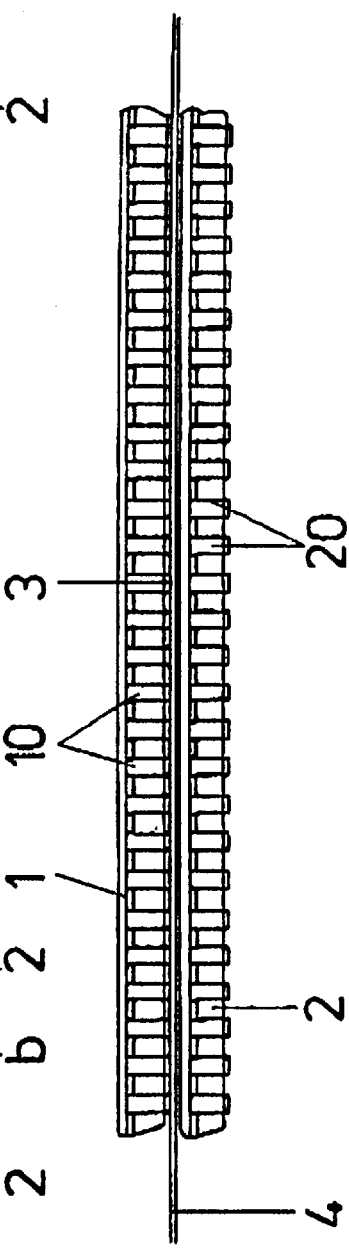
FIG. 12 is a side-elevational view of the configuration according to FIG. 10 or FIG. 11 rotated through 90 degrees about the vertical axis.

FIG. 12, finally, shows an enlarged side view of the configuration according to FIG. 10, which is rotated through 90 degrees about the vertical axis as compared with the view according to FIG. 10.

The configurations according to FIG. 8 to FIG. 12 are primarily distinguished by the fact that cost-effective and therefore industrially interesting automated blank mounting is particularly straightforwardly possible by using them.

The invention is not restricted to the exemplary embodiment illustrated in the figures, but rather can be transferred to further exemplary embodiments.

For example, it is possible to split the free ends 30 of the individual connecting lines of the leadframe 3 in the longitudinal direction in a v shape or s shape, symmetrically with respect to the horizontal.

Furthermore, it is possible to stack more than two TSOP memory chip housings 1, 2 one on another, each having the leadframe 3 located between them or at the side between them.

Finally, it is possible to dispose a number of such stacks in the form of a two-dimensional stack array on a common carrier.

We claim:

1. A configuration, comprising:
   a rewiring configuration formed as a leadframe having connecting lines with free ends, said free ends having a cross-sectional shape selected from the group consisting of groove-shaped free ends, trough-shaped free ends, u-shaped free ends and v-shaped free ends; and
   at least two thin small online package (TSOP) memory chip housings having contours of identical cross section, including a first TSOP memory chip housing and a second TSOP memory chip housing, stacked one on another, each of said two TSOP memory chip housings having an interior and at least one memory chip with a number of pins disposed in said interior of each of said two TSOP memory chip housings, said leadframe disposed one of between said two TSOP memory chip housings and at a side between said two TSOP memory chip housings, said pins leading out of said first TSOP memory chip housing being connected through said leadframe to said pins leading out of said second TSOP memory chip housing, said pins having ends leading out of said two TSOP memory chip housings and said ends formed in a shape selected from the group consisting of s-shaped ends in cross-section, step-shaped ends in cross section, kinked over downward ends and kinked over upward ends, and said pins of different ones of said two TSOP memory chip housings disposed one over another and aligned in parallel with one another in space.

2. The configuration according to claim 1, wherein said connecting lines of said leadframe are shaped at said free ends such that said free ends connect said pins in each case located directly one next another of said two TSOP memory chip housings.

3. The configuration according to claim 1, wherein at least one of said two TSOP memory chip housings is connected mechanically to said leadframe.

4. The configuration according to claim 1, wherein said pins are one of soldered and welded to said free ends of said connecting lines of said leadframe.

5. The configuration according to claim 1, wherein at least one of said two TSOP memory chip housings is connected mechanically, by an adhesive bond, to said leadframe.

6. A configuration, comprising:

thin small online package (TSOP) memory chip housings having contours of identical cross section, each of said TSOP memory chip housings having an interior and at least one memory chip with a number of pins disposed in said interior of each of said TSOP memory chip housings and said pins leading out of said TSOP memory chip housings; and a plurality of leadframes each having connecting lines with free ends, said free ends having a cross-sectional shape selected from the group consisting of groove-shaped free ends, trough-shaped free ends, u-shaped free ends and v-shaped free ends, each of said leadframes disposed one of between two of said TSOP memory chip housings and at a side between two of said TSOP memory chip housings;

a respective one of said leadframes and a respective two of said TSOP memory chip housings including a first TSOP memory chip housing and a second TSOP memory chip housing, stacked one on another with said respective leadframe disposed inbetween forms one of a plurality of stacks, said pins leading out of said first TSOP memory chip housing being connected through said respective leadframe to said pins leading out of said second TSOP memory chip housing, said pins having ends leading out of said two TSOP memory chip housings and said ends formed in a shape selected from the group consisting of s-shaped ends in cross-section, step-shaped ends in cross section, kinked over downward ends and kinked over upward ends, and said pins of different ones of said two TSOP memory chip housings disposed one over another and aligned in parallel with one another in space.

7. The configuration according to claim 6, including a common carrier and at least two of said stacks are disposed beside one another, and in that said leadframes of said at least two stacks are disposed on said common carrier.

* * * * *